United States Patent [19]

Tanaka et al.

[11] 4,210,464
[45] Jul. 1, 1980

[54] METHOD OF SIMULTANEOUSLY CONTROLLING THE LIFETIMES AND LEAKAGE CURRENTS IN SEMICONDUCTOR DEVICES BY HOT ELECTRON IRRADIATION THROUGH PASSIVATING GLASS LAYERS

[75] Inventors: Tomoyuki Tanaka; Masahiro Okamura; Toshikatsu Shirasawa; Takuzo Ogawa, all of Hitachi, Japan

[73] Assignee: Hitachi, Ltd., Japan

[21] Appl. No.: 873,774

[22] Filed: Jan. 31, 1978

[30] Foreign Application Priority Data

Feb. 2, 1977 [JP] Japan .................................. 52-9682

[51] Int. Cl.² .................. H01L 21/263; C03C 3/04
[52] U.S. Cl. ............................. 148/1.5; 148/187; 357/23; 357/29; 357/91
[58] Field of Search .................. 357/73, 29, 91; 148/1.5, 187

[56] References Cited

U.S. PATENT DOCUMENTS

| | | | |
|---|---|---|---|
| 3,551,171 | 12/1970 | Thomas | 106/53 |
| 3,778,242 | 12/1973 | Francel et al. | 65/43 |
| 3,829,961 | 8/1974 | Bauerlein et al. | 29/585 |
| 3,933,527 | 1/1976 | Tarnesa et al. | 148/1.5 |
| 3,938,178 | 2/1976 | Miura et al. | 357/91 |
| 4,043,836 | 8/1977 | Sheng et al. | 148/1.5 |
| 4,043,837 | 8/1977 | Cresswell et al. | 148/1.5 |
| 4,076,555 | 2/1978 | Chu et al. | 148/1.5 |
| 4,080,621 | 3/1978 | Funakawa et al. | 357/54 |

Primary Examiner—L. Dewayne Rutledge
Assistant Examiner—Upendra Roy
Attorney, Agent, or Firm—Craig and Antonelli

[57] ABSTRACT

The whole body of a semiconductor device with its pn junction exposed ends covered by insulating glass is subjected to the exposure to radiation having an energy of higher than 0.5 MeV in terms of the reduced energy of electron beams while the semiconductor device is maintained at temperatures higher than 300° C., and preferably higher than 350° C. As a result, the life time of the minority carriers in the semiconductor device can be shortened without increasing the leakage current in the reverse direction.

7 Claims, 5 Drawing Figures

METHOD OF SIMULTANEOUSLY CONTROLLING THE LIFETIMES AND LEAKAGE CURRENTS IN SEMICONDUCTOR DEVICES BY HOT ELECTRON IRRADIATION THROUGH PASSIVATING GLASS LAYERS

BACKGROUND OF THE INVENTION

1. Field of the Invention

This invention relates to the method of fabricating a semiconductor device in which the exposed end of at least one of the pn junctions is covered by a glass insulator and more particularly to the method of reducing the life time of the minority carriers in the semiconductor without increasing the leakage current in the reverse direction.

2. Description of the Prior Art

To enable semiconductor devices such as a diode, a transistor, a thyristor etc. to operate at high switching speeds, it is necessary to annihilate the excess minority carriers in the semiconductor devices as fast as possible. The velocity at which the excess minority carriers are annihilated is roughly known from the life time of the minority carriers. It is therefore essential for high speed operation to render the life time of the minority carriers as short as possible.

The conventional method of shortening the life time of the minority carriers as resorted to, for example, the use of heavy metal such as gold, which forms recombination centers in the semiconductor. The high temperature diffusion method is in most cases used to dope gold atoms into the semiconductor. According to this method, however, the distribution of the gold atoms in the semiconductor wafer is uneven and moreover the reproducibility and the controllability of the gold atom concentrations are hardly satisfactory. In addition, this method cannot be free from a fatal drawback that the leakage current increases when the PN junction is reversely biased.

Among the conventional methods of shortening the life time of minority carriers is also known a method which utilizes a fact that the lattice defects caused through the irradiation of semiconductor with radiation such as electron beams, gamma rays etc. serve as recombination centers, as disclosed in, for example, U.S. Pat. Nos. 3,809,582 and 3,888,701 wherein it is stated that the drawback of the method of shortening the life time due to the gold diffusion is eliminated and that the concentrations of the recombination centers have an excellent uniformity, reproducibility and controllability without increase in the leakage current in the reverse direction.

Another relevant prior art is the Japanese patent application laid-open No. 3271/72, "Method of improving the radiation-resistivity of a silicon transistor." According to this method, a silicon transistor having a $SiO_2$ film, maintained at temperatures of 150° to 450° C., is irradiated with electron beams having an energy of lower than 150 KeV.

In order to improve the blocking voltage and the reliability of a semiconductor device, the material for surface passivation must be carefully chosen. Recently a resin-mold or plastic casing has been used to encapsulate a semiconductor device. In such a casing, glass insulator having an excellent resistivity to moisture and a high reverse-blocking voltage is preferably used as the surface passivation material for the semiconductor device.

However, the inventors' experiments have revealed that if a semiconductor device with the exposed ends of its pn junctions covered with glass layers is exposed to radiation at room temperatures, the leakage current in the reverse direction in the semiconductor device extremely increases. It was also found by the experiments that such an increase in the leakage current takes place manifestly particularly where glass insulator is used as surface passivation material, but that the increase in the leakage current hardly takes place where the passivation layer of $SiO_2$ or resin is used, the $SiO_2$ or resin passivation layer being conventionally known. Moreover, the experiments have made it clear that the increase in the reverse leakage current is dependent on the energy of the radiation source and its irradiation dosage and that the leakage current necessarily increases under such an irradiating condition that the life time of the minority carriers in the semiconductor device is substantially shortened. The increase in the leakage current must be prevented without fail since it is causative of the increase in the consumption of power by the semiconductor device and thermal runaway leading to the damage of the semiconductor device.

SUMMARY OF THE INVENTION

The object of this invention is to provide a method of fabricating a semiconductor device having at least one pn junction whose exposed edges are covered with glass insulator and having a shortened carrier life time without increasing the reverse leakage current.

The feature of this invention, which has been made to attain the above object, is to shorten the life time of the minority carriers in a semiconductor device by irradiating with radiation the semiconductor substrate having the exposed edges of at least one pn junction thereof covered with glass insulator while maintaining the substrate at high temperatures above 300° C.

DESCRIPTION OF THE PREFERRED EMBODIMENTS

Figure 1:
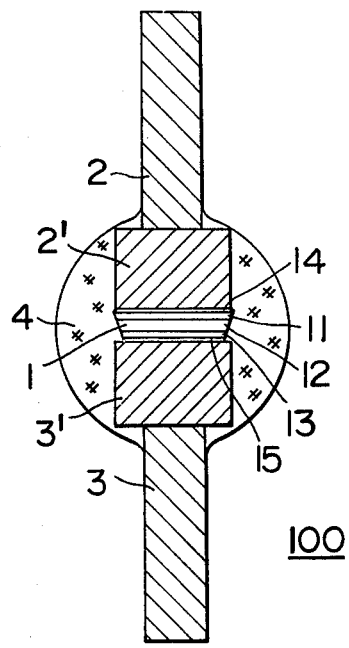
FIG. 1 shows in cross section a silicon diode coated by glass insulator, to be irradiated with radiation according to this invention.

In this invention, electron beams and gamma rays can be used as radiation. Electron beams are particularly recommended from the practical standpoint that the source for emitting electrons is easy of treatment and that the irradiation dosage can be easily controlled. The energy of the radiation source must be large enough to generate at least lattice defects of Frenkel type in the semiconductor to be irradiated. For example, the energy level of radiation should be higher than about 0.5 MeV where electron rays are emitted directly on a silicon substrate and still higher where the electron rays are projected on the substrate through a metal electrode or glass insulator layer.

The desired irradiation dosage should be chosen depending on the life time value to be attained through irradiation and the life time value possessed by the semiconductor before irradiation, and it is more than $1 \times 10^{13}$ electrons/cm$^2$ for an ordinary silicon device. However, the dosage exceeding $1 \times 10^{17}$ electrons/cm$^2$ is not preferable since in such a case the forward voltage drop in the semiconductor device may increase to an unpractical extent.

If gamma rays are used as radiation, the irradiation dosage should be more than 2.5 Mrad.

Semiconductor devices to be subjected to the irradiation are prepared by the conventional methods including the doping and passivation steps. In the present invention, the passivation is performed with a glass which is free of alkali metal ions and has a coefficient of linear thermal expansion approximate to that of the semiconductor substrate employed. A variety of glass compositions for use in passivation of semiconductor bodies have been proposed and are disclosed in U.S. Pat. Nos. 3,486,871; 3,551,171; 3,778,242; 3,650,778; 3,752,701 and 3,674,520. Typical glass compositions useful as a passivating glass layer for the devices of the present invention are (1) a $ZnO-B_2O_3-SiO_2$ system, (2) a $B_2O_3-PbO-SiO_2$ system, and (3) a $ZnO-B_2O_3-SiO_2-PbO$ system. The glass compositions are selected to have a coefficient of linear thermal expansion of about $100 \times 10^{-7}/°C$. or less, preferably $80 \times 10^{-7}/°C$. or less over a temperature range of 100° to 350° C. Of the conventional alkali-free glasses preferable compositions are shown as follows:

| (1) | $ZnO$ | 63% | by weight |
|---|---|---|---|
| | $B_2O_3$ | 20 | by weight |
| | $SiO_2$ | 9.4 | by weight |
| | $PbO$ | 4.3 | by weight |
| | $Sb_2O_3$ | 0.5 | by weight |
| | $SnO_2$ | 1.2 | by weight |
| | $Al_2O_3$ | 0.09 | by weight |
| (2) | $ZnO$ | 62% | by weight |
| | $B_2O_3$ | 20 | by weight |
| | $SiO_2$ | 9.5 | by weight |
| | $SnO_2$ | 0.7 | by weight |
| | $PbO$ | 2.8 | by weight |
| | $Sb_2O_3$ | 1.5 | by weight |
| | $Al_2O_3$ | 0.1 | by weight |
| (3) | $ZnO$ | 54% | by weight |
| | $B_2O_3$ | 16 | by weight |
| | $SiO_2$ | 7.8 | by weight |
| | $SnO_2$ | 1.1 | by weight |
| | $PbO$ | 4.3 | by weight |
| | $Sb_2O_3$ | 0.4 | by weight |
| | $PbTiO_3$ | 12.3 | by weight |

Preferable glasses may be chosen within the following composition:

| $ZnO$ | 50 to 80% by weight |
|---|---|
| $B_2O_3$ | 5 to 30% by weight |
| $SiO_2$ | 1 to 10% by weight |
| $PbO$ | up to 10% by weight |
| $Sb_2O_3$ | up to 5% by weight |
| $SnO_2$ | up to 5% by weight |
| $Al_2O_3$ | up to 5% by weight |

The inventors have ascertained through experiments that if a semiconductor device with the exposed edges of its pn junctions covered by one of the glass insulators listed above is entirely subjected to the irradiation of radiation while kept under temperatures higher than 300° C., the increase in the leakage current due to the irradiation thereafter can be prevented. The temperature at which the semiconductor device is to be kept when irradiated with radiation, should be higher than 300° C., and particularly higher than 350° C. so as to promote the effect of this invention. To keep the semiconductor device at extremely high temperatures during irradiation, however, is not preferable since too high a temperature during irradiation may deteriorate other properties of the device. For example, some semiconductor devices may have a reverse recovery time after irradiation, not so much shorter than the reverse recovery time before irradiation if the device is kept at temperatures higher than about 450° C. during irradiation. Further, the upper limit of temperature must be taken into consideration in order that in case where the semiconductor device having provided with, for example, electrodes, the electrode material may not be oxidized or alloyed with the semiconductor and the soldering material may not be softened. For example, aluminum is often used as an electrode material and soldering material for silicon element and since its eutectic temperature with silicon is 577° C., the semiconductor device should not be kept at temperatures higher than 577° C. The temperature at which the semiconductor device is kept during irradiation should thus be chosen in view of the above mentioned risks. For the same radiation dosage, the life time value becomes larger under higher temperatures than under lower temperatures. And under the same temperature, the value decreases with the increase in irradiation dosage. Accordingly, the temperature during irradiation and the irradiation dosage should be determined depending on a desired life time value.

FIG. 1 shows in cross section a glass-molded diode to which this invention is applied. A diode 100 comprises a silicon pellet 1, an anode and a cathode terminals 2' and 3' soldered to both the main surfaces of the pellet 1, lead wires 2 and 3 connected with the terminals 2' and 3' respectively, and a glass insulator 4 for passivating the silicon pellet 1. The silicon pellet 1 consists of a p$^+$-type diffusion layer 11, an n-type layer 12 of high resisitivity and an n$^+$-type diffusion layer 13. A pn junction is established between the p$^+$-type diffusion layer 11 and the n-type high resistivity layer 12. This semiconductor device shown in FIG. 1 is fabricated as follows. Boron and phosphorus are successively diffused in the order mentioned into both the main surfaces of a silicon wafer of n-conductivity type, having a resistivity of 30 Ω-cm and a thickness of about 270 μm, to form the p$^+$-type and n$^+$-type layers 11 and 13. Then, aluminum is vapor-deposited to form electrode binding layers 14 and 15 and after the wafer is scribed into pellets each having a diameter of 1.4 mm, the terminals 2' and 3' and the lead wires 2 and 3 of tungsten having the same thermal expansion coefficient as silicon are attached to the wafer. Further, the globular glass insulator 4 is formed around the pellet 1 as shown in FIG. 1. In the glass coating treatment, zinc borosilicate series glass of the following composition was employed:

TABLE

| Ingredients | Ingredient Ratios (% by weight) |
| --- | --- |
| ZnO | 63.1 |
| $B_2O_3$ | 20.47 |
| $SiO_2$ | 9.388 |
| PbO | 4.29 |
| $Sb_2O_3$ | 0.476 |
| $SnO_2$ | 1.23 |
| $Al_2O_3$ | 0.087 |

The glass material is dispersed into water to form glass slurry, which is applied to at least the peripheral portions of the silicon pellet 1 and the terminals 2' and 3'. Thereafter, the deposited glass slurry was baked to fuse, whereby the surface of the pn junction of the device 100 is passivated, and at the same time, the pellet is protected against mechanical damage.

Figure 2:
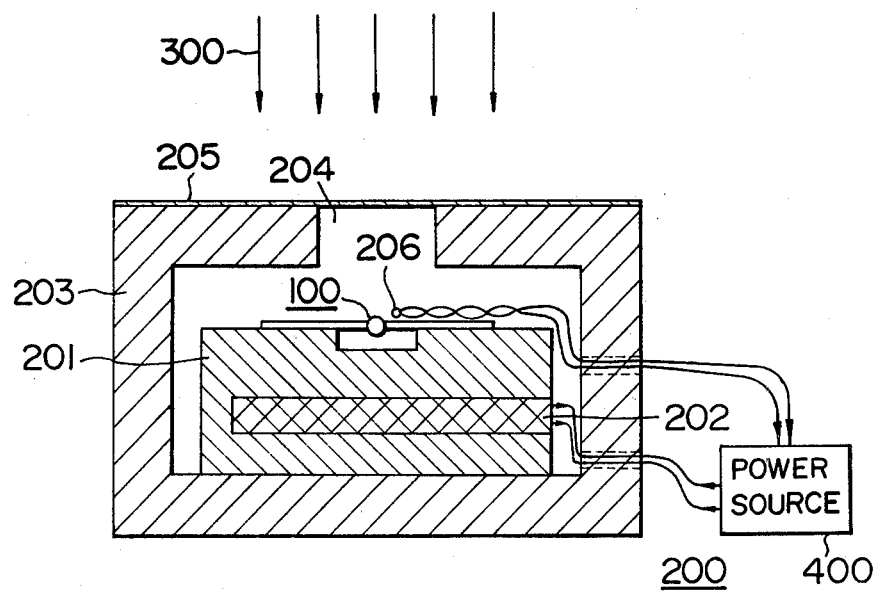
FIG. 2 shows in cross section an apparatus for irradiating a semiconductor device according to this invention.

FIG. 2 shows how the diode shown in FIG. 1 is irradiated with electron rays according to a method embodying this invention. In FIG. 2, an apparatus 200 for heating a sample consists of a stainless steel block 201, a cartridge heater 202 encased in the stainless steel block 201 to heat the block 201 and a wall member 203 of heat shielding material such as asbestos. An opening 204 is cut in the upper portion of the wall member 203 to let electron rays 300 irradiate the diode 100. The opening 204 is covered with aluminum foil 205 so as to decrease heat dissipation therethrough. The thickness of the Al foil 205 is about 100 μm so that the electron rays easily penetrate through the foil 205.

With the diode 100 before the irradiation of the electron rays, the leakage current was $7 \times 10^{-9} - 9 \times 10^{-8}$ A (at reverse bias voltage of 400 V), the forward voltage drop about 1.0 V (for forward current of 4 A) the reverse recovery time 7-9 μsec, the life time of minority carriers about 8-10 μsec and the blocking voltage about 900 V. The diode 100 having the above characteristics was placed in the proper position in the heating apparatus 200 and heated to a predetermined temperature by the heater 202 powered by a power source 400 placed outside the heating apparatus 200. The temperature of the diode 100 is detected by a thermocouple 206 disposed in the vicinity of the diode 100. If the actual temperature of the diode 100 deviates largely from the predetermined value, it is corrected by controlling the power supplied from the source 400 to the heater.

With the diode 100 kept at the predetermined temperature, the irradiation of the diode 100 was performed with electron rays 300 having energy of 2 MeV until the irradiation dosage reached $1 \times 10^{15}$ electrons/cm$^2$. The time required for irradiation was about 5 minutes. After the irradiation, the diode 100 was taken out of the heating apparatus 200 and the reverse recovery time and the leakage current were measured.

Figure 3:
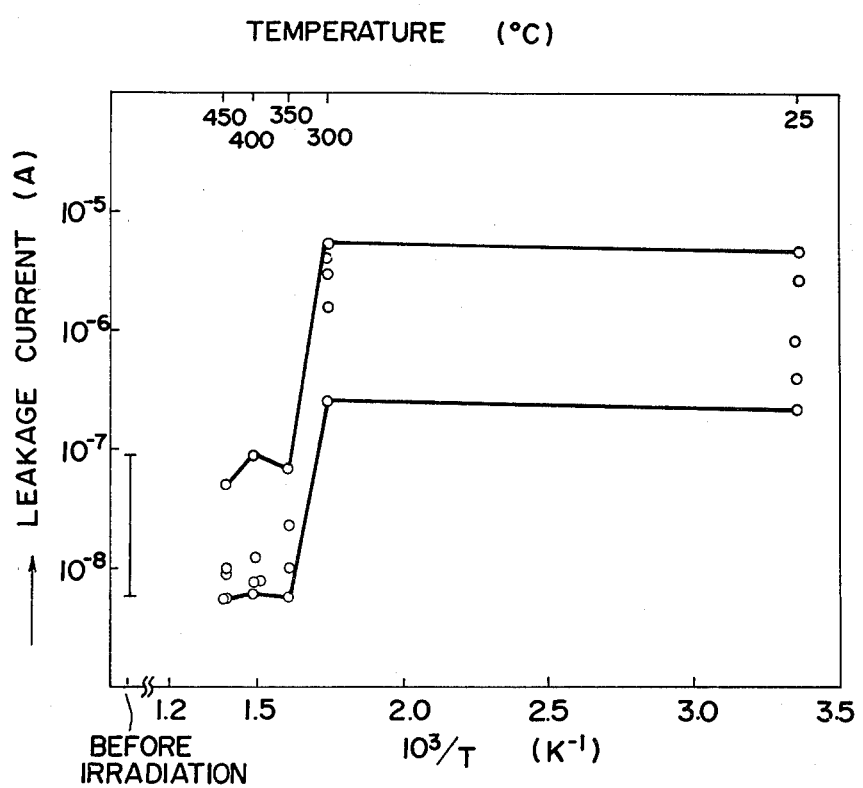
FIG. 3 graphically shows the relationship between the temperature and the reverse leakage current of the semiconductor device when it is irradiated with radiation.

FIG. 3 graphically shows the values of the reverse leakage current plotted against the values of temperatures, in case of the diode 100 treated as above. FIG. 3 shows that the leakage currents due to irradiation at room temperatures (25° C.) to 300° C. increase to 10-100 times that before irradiation. Upon irradiation at temperatures above 300° C., however, the leakage current decreases. The irradiation at temperatures higher than about 350° C. decreases the leakage current to a remarkable extent, i.e. to the value almost equal to that having before irradiation. Thus, the effect of this invention is found to be enjoyed to full extent.

Figure 4:
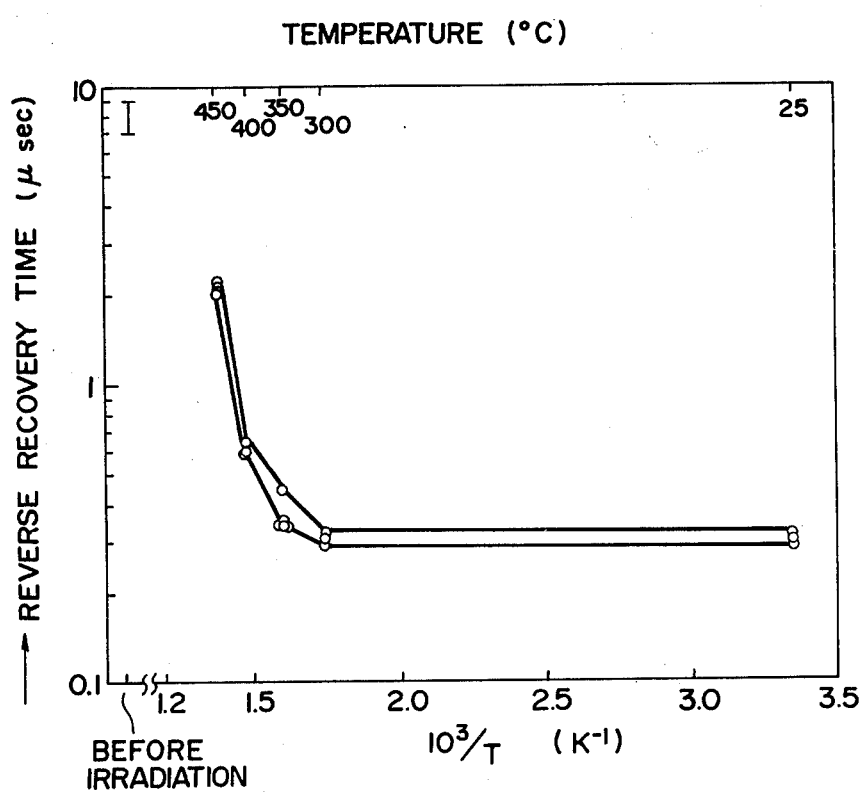
FIG. 4 graphically shows the relationship between the temperature and the reverse recovery time of the semiconductor device when it is irradiated with radiation.

FIG. 4 graphically shows the values of the reverse recovery time plotted with the temperature of the diode 100 varied. FIG. 4 shows that the reverse recovery time is rendered shorter after irradiation than before irradiation for all the values of temperature. Namely, although the reverse recovery time is somewhat larger upon irradiation above 300° C. than upon irradiation below 300° C., the values of 0.3 μsec (at 300° C.) and 2 μsec (at 450° C.) which is the maximum value in this embodiment are evidence of a great improvement over the values of 7-9 μsec measured before irradiation. Incidentally, the irradiation dosage in this embodiment was $1 \times 10^{15}$ electrons/cm$^2$, but the same effect can be attained irrespective of the radiation dosage. For example, almost the same result has been achieved by using an irradiation dosage of $5 \times 10^{14}$ electrons/cm$^2$ with the other conditions unaltered. It was also ascertained that if the method according to this invention was applied to a semiconductor device wafer before attaching electrodes, the effect of this invention remained unchanged against heating for the attachment of electrodes.

Figure 5:
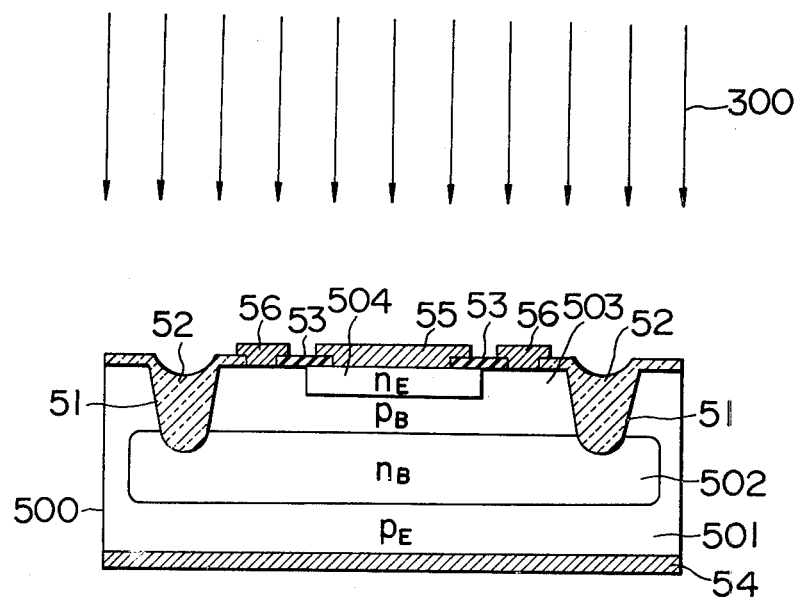
FIG. 5 shows in cross section a thyristor having the exposed edge of its pn junction covered with glass insulator, to be irradiated with radiation according to this invention.

FIG. 5 shows in cross section a thyristor to which the present invention is applied. A silicon substrate 500 comprises a p+-type emitter layer 501, an n-type base layer 502, a p-type base layer 503 and an n+-type emitter layer 504. pn junctions are formed between different type layers. The pn junction formed between the n+-type emitter layer 504 and the p-type base layer 503 has an edge exposed in one main surface of the silicon substrate 500 and the edge is coated with a surface passivation film 53 of $SiO_2$. The surface passivation film 53 is obtained by forming a $SiO_2$ film entirely on the one main surface of the silicon substrate 500 by chemical vapor deposition method and then by etching away the $SiO_2$ film except portions necessary for passivation.

The active region of the thyristor is surrounded by a circular groove 51 whose bottom reaches at least the n-type base layer 502, and the groove 51 is filled with glass material 52. The glass used to cover the silicon diode shown in FIG. 1 may be used as the glass material 52. Preferable composition of such a glass material is as follows.

TABLE

| Ingredients | Ingredient Ratios (% by weight) |
| --- | --- |
| ZnO | 63.1 |
| $B_2O_3$ | 20.47 |
| $SiO_2$ | 9.388 |
| PbO | 4.29 |
| $Sb_2O_3$ | 0.476 |
| $SnO_2$ | 1.23 |
| $Al_2O_3$ | 0.087 |

The glass material is ground to powder and the powder is dispersed into water to form a glass slurry. The glass slurry is filled into the groove 51 and sintered at a temperature within a range from 670° C. to 710° C., e.g., at 685° C. As a result, the pn junctions between the n-type base layer 502 and the p-type base layer 503 and between the p+-type emitter layer 51 and the n-type base layer 502 have their edges coated by the glass material 52 for surface passivation.

A cathode electrode 55 is formed on that portion of the surface of the n+-type emitter layer 504 which is not covered by the $SiO_2$ film 53, a gate electrode 56 on that portion of the surface of the p-type base layer 503 which is not covered by the $SiO_2$ film 53 and the glass 52, and an anode electrode 54 on the surface of the p-type emitter layer 501.

The thus fabricated thyristor was placed in the proper position in the heating apparatus 200 shown in FIG. 2, heated up to a predetermined temperature and subjected to irradiation with electron rays 300. This invention can also be applied to a semiconductor device in which all the exposed edges of the pn junctions are not covered by glass. According to this invention, it is necessary for the improvement in anti-moisture property and reverse blocking voltage that the exposed edges of at least the pn junction substantially responsible for the blocking voltage of the device should be coated with glass, but it is possible to cover the exposed edges of the other pn junctions with other passivation material such as $SiO_2$ and resin, if necessary. For example, with the thyristor shown in FIG. 5, the pn junction between the $n^+$-type emitter layer 504 and the p-type base layer 503 does not constitute any substantial contribution to the determination of the blocking voltage in the forward or reverse direction and therefore the edge of the pn junction is covered with the $SiO_2$ film 53.

In the foregoing description, the present invention has been shown as applied exclusively to the diode and the thyristor but it will be apparent to those skilled in the art that the invention can be applied equally to other elements such as an electric field controlled thyristor and a transistor.

We claim:

1. A method of controlling the lifetime of minority carriers in a semiconductor device without increasing the reverse leakage current in said device, wherein said semiconductor device has a semiconductor substrate including a pn junction substantially responsible for the blocking voltage of the device, said method comprising the steps of:

coating an exposed end of said pn junction with a glass insulator material substantially free of alkali metal ions to provide a passivating glass layer thereon;

sintering said glass material by heating said layer; and reducing said lifetime by irradiating said pn junction having said passivating glass layer with radiation capable of causing lattice defects in said semiconductor device at a temperature above 300° C. in a temperature range wherein a reverse leakage current in said substrate is made smaller than that current obtained when said pn junction is subjected to said irradiation at room temperature and wherein the electrical characteristics of said device are not deteriorated.

2. A method as claimed in claim 1, wherein said glass material is selected from the group consisting of a $ZnO$-$B_2O_3$-$SiO_2$ system, a $B_2O_3$-$PbO$-$SiO_2$ system and a $ZnO$-$B_2O_3$-$SiO_2$-$PbO$ system, substantially contains no alkali metal ions and has a thermal expansion coefficient approximately equal to that of said substrate.

3. A method as claimed in claim 1, wherein said radiation is electron rays having energy of higher than 0.5 MeV.

4. A method as claimed in claim 1, wherein said semiconductor substrate is heated and kept at temperatures above 350° C. when irradiated with radiation.

5. A method as claimed in claim 3, wherein the irradiation dosage of said electron rays is more than $1 \times 10^{13}$ electrons/$cm^2$.

6. A method as claimed in claim 1, wherein said semiconductor substrate is kept during irradiation at temperatures lower than the value at which said life time of carriers after irradiation becomes equal to the life time of carriers before irradiation.

7. A method of controlling the lifetime of minority carriers in a semiconductor substrate having at least one pn junction that is responsible for a blocking voltage of a semiconductor device formed by said substrate, which comprises:

coating an exposed end of said pn junction with a passivating glass insulator material layer that is substantially free of alkali metal ions; and reducing the lifetime by irradiating said pn junction having said passivating glass material layer with radiation capable of causing lattice defects in said semiconductor device at a temperature above 300° C. whereby a reverse leakage current in said substrate of said device is made smaller than when said pn junction is subjected to said irradiation at room temperature.

* * * * *